US008829407B2

(12) United States Patent
Ladd et al.

(10) Patent No.: US 8,829,407 B2
(45) Date of Patent: Sep. 9, 2014

(54) IMAGING SYSTEMS AND METHODS INCLUDING PIXEL ARRAYS WITH REDUCED NUMBERS OF METAL LINES AND CONTROL SIGNALS

(75) Inventors: John Ladd, San Jose, CA (US); Gennadiy Agranov, San Jose, CA (US); Xiangli Li, San Jose, CA (US)

(73) Assignee: Aptina Imaging Corporation, George Town, Grand Cayman ( * ) Notice: Subject to any disclaimer, the term of this patent is extended or adjusted under 35 U.S.C. 154(b) by 768 days.

(21) Appl. No.: 12/907,465

(22) Filed: Oct. 19, 2010

(65) Prior Publication Data

US 2012/0091317 A1    Apr. 19, 2012

(51) Int. Cl.
*H01L 27/00*      (2006.01)
*G01J 1/44*       (2006.01)
*H01L 27/146*     (2006.01)
*H04N 5/3745*     (2011.01)
*H04N 5/374*      (2011.01)

(52) U.S. Cl.
CPC ............. *H01L 27/14641* (2013.01); *G01J 1/44* (2013.01); *H04N 5/3745* (2013.01); *H04N 5/3741* (2013.01)
USPC ...................... 250/208.1; 250/214.1; 348/281; 348/302; 348/324; 257/239

(58) Field of Classification Search
USPC ............ 250/208.1, 214.1; 348/281, 302, 324; 257/239
See application file for complete search history.

(56) References Cited

U.S. PATENT DOCUMENTS

| | | | |
|---|---|---|---|
| 6,853,044 B1* | 2/2005 | Chung et al. .................. 257/444 |
| 7,081,607 B1* | 7/2006 | Koizumi .................... 250/208.1 |
| 8,334,491 B2* | 12/2012 | Bogaerts et al. ........... 250/208.1 |
| 2013/0048831 A1* | 2/2013 | Bikumandla .............. 250/208.1 |

* cited by examiner

*Primary Examiner* — Georgia Y Epps
*Assistant Examiner* — Kevin Wyatt
(74) *Attorney, Agent, or Firm* — Kramer Levin Naftalis & Frankel LLP

(57) ABSTRACT

This is generally directed to systems and methods for reduced metal lines and control signals in an imaging system. For example, in some embodiments a pixel cell of an imaging system can operate without a row select transistor, and therefore can operate without a row select metal control line. As another example, in some embodiments a pixel cell can share its reset transistor control line with a transfer transistor control line of another pixel cell. In this manner, an imaging system can be created that averages a single metal line per pixel cell. In some embodiments, operation of such reduced-metal line imaging systems can use modified timing schemes of control signals.

18 Claims, 10 Drawing Sheets

IMAGING SYSTEMS AND METHODS INCLUDING PIXEL ARRAYS WITH REDUCED NUMBERS OF METAL LINES AND CONTROL SIGNALS

FIELD OF THE INVENTION

The present invention relates to imaging systems and methods using pixel arrays with reduced metal lines and control signals. In particular, this can relate to imaging systems and methods using pixel arrays with a shared TX and RST metal line and in which the Row Select line has been eliminated.

BACKGROUND OF THE INVENTION

Imaging systems today often include an array of pixel cells arranged in a predetermined number of columns and rows. Each of the pixel cells can be configured to sense an amount of light impinging on that pixel cell, and generate an appropriate signal corresponding to that amount of sensed light.

Generally, each pixel cell can include a number of metal lines coupled to that pixel cell, where control signals can be applied to these metal lines for controlling the operation of the pixel cell. For example, a pixel cell can include a reset ("RST") metal line to which a RST control signal can be applied for resetting the pixel cell, a transfer ("TX") metal line to which a TX control signal can be applied for transferring accumulated charges (e.g., accumulated by a photodiode) towards an output node, and a row select ("RS) metal line to which a RS signal can be applied to select a particular pixel cell's row for signal readout. Although this plurality of metal lines can be functional, the additional metal in the pixel array may detrimentally affect the imaging system. For example, the multiple lines of metal can take up room on the imaging die, thus reducing optical fill factor of the pixel and preventing at least some light going into silicon sensing area. Moreover, the multiple metal lines can increase metal coupling, thereby increasing noise, and reducing the conversion gain and the sensitivity of the imaging system.

DETAILED DESCRIPTION OF THE INVENTION

Figure 1:
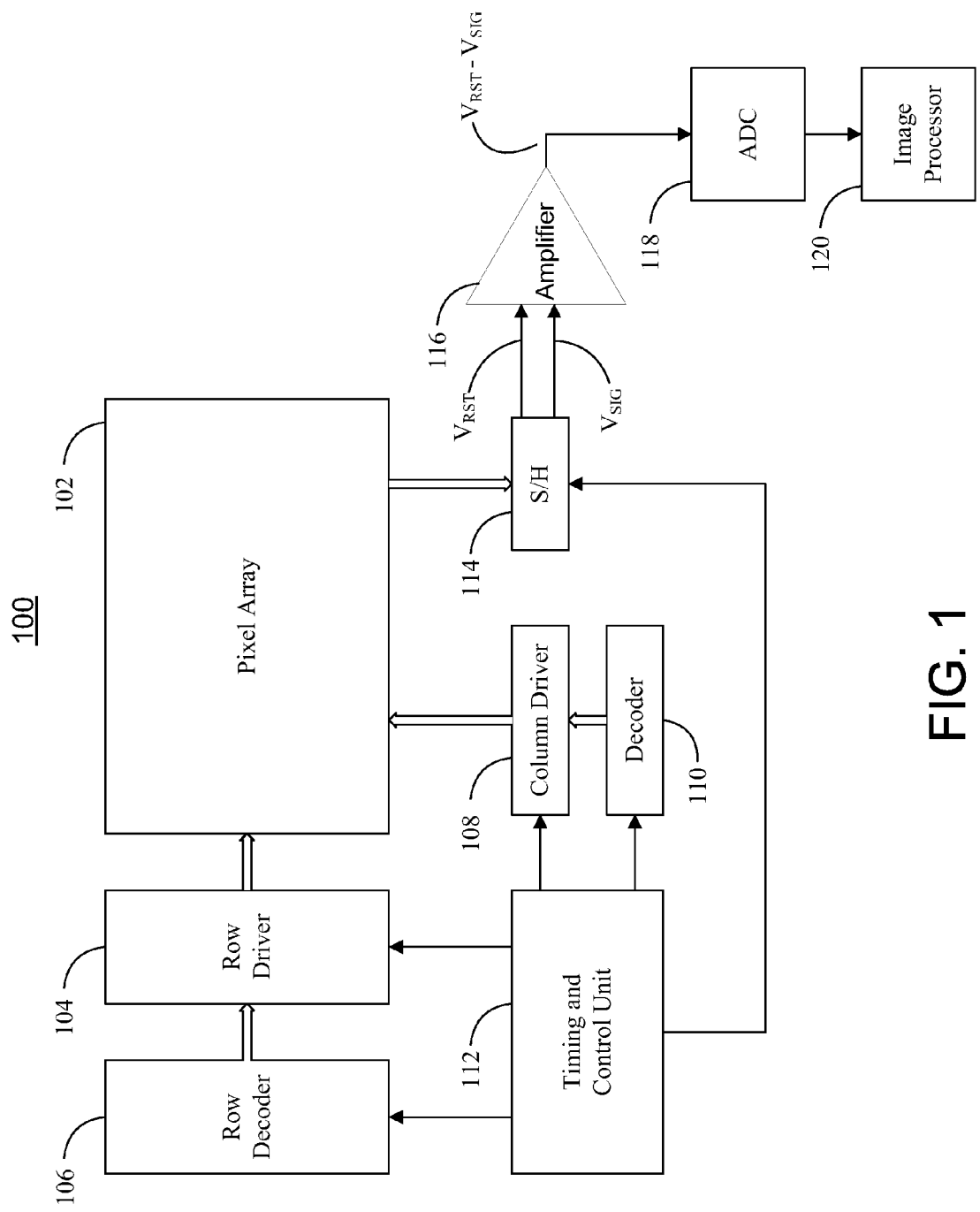
FIG. 1 shows a schematic view of an illustrative imaging system in accordance with some embodiments on the present invention.

FIG. 1 shows a schematic view of illustrative imaging system 100 in accordance with some embodiments of the present invention. Imaging system 100 can include an imaging system included in any suitable electronic device such as, for example, a camera, a video camcorder, a cellular phone camera, and image recognition system, and the like. In some embodiments, imaging system 100 could represent a complimentary metal oxide semiconductor ("CMOS") imagining system. However, although imaging system 100 and the following embodiments may refer to the particular example of a CMOS imaging system, this is merely for the purpose of illustration and not for limitation. Rather, one skilled in the art could appreciate that any other suitable imaging system could alternatively be used. Moreover, in some embodiments, one or more of the components of imaging system 100 can be combined, omitted, or can included several instances of the components, or imaging system 100 can include other components not included in those shown in FIG. 1.

Imaging system 100 can have pixel array 102 that can included pixels cells arranged in a predetermined number of columns and rows. In some embodiments, the pixel cells of pixel array 102 can include one or more light-sensing pixel cells, black pixel cells, barrier pixel cells, and the like. In operation, rows and columns of pixel cells of pixel array 102 can be selectively activated and/or read from pixel array 102. For example, the rows can be selectively activated by row driver 104 in response to row driver 104 receiving a row address from row decoder 106. Similarly, the columns can be selectively activated by column driver 108 in response to column driver 108 receiving a column address from column decoder 110. In this manner, each pixel cell of pixel array 102 can be selectively activated and/or read from pixel array 102 by providing the appropriate row and column address with, respectively, row decoder 106 and column decoder 110.

Timing and control unit 112 can instruct row decoder 106 and column decoder 110 to select an appropriate row and column line, thus selecting a particular pixel cell. Furthermore, timing and control unit 112 can apply driving voltages (e.g., control signals) to the particular pixel cell and to sample and hold ("S/H") circuitry 114, thereby enabling the capture and reading of image data generated by the pixel cells.

As described above, S/H 114 can be controlled by timing and control unit 112. During sampling of the pixel cells, each pixel cell of pixel array 102 can output a reference level ("$V_{RST}$") and a signal level ("$V_{SIG}$"), which may be received by S/H 114. For example, row driver 104 can select an indicated row for the capture and reading of $V_{RST}$ and $V_{SIG}$ from the pixel cell's of that row. Column driver 108 can then select each pixel cell of the selected row for sampling by S/H 114. S/H 114 may, for example, sample, hold, and/or amplify $V_{RST}$ and $V_{SIG}$. For example, in some embodiments, S/H 114 can include capacitors, where one capacitor can be used to store the $V_{RST}$ signal and one can be used to store the $V_{SIG}$ signal. In some embodiments, this technique of sampling two signals from each pixel cell can be referred to as "correlated double sampling."

$V_{RST}$ and $V_{SIG}$ may then be provided to differential amplifier 116 which can determine the differential output signal, $V_{OUT}=V_{RST}-V_{SIG}$. This differential signal can represent, for example, the actual pixel output with common-mode noise eliminated.

The differential output signal, $V_{OUT}$, can be digitized by analog to digital converter ("ADC") 118. ADC 118 may then communicate the digitized signals to image processor 120. Image processor 120 can create a digital image from the digitized signals in any suitable manner and can perform any suitable image processing such as, for example, noise reduction, image dewarping, image rotations, image perspective adjustments, image panning, image tilting, imaging zooming, or any other suitable image processing.

Figure 2:
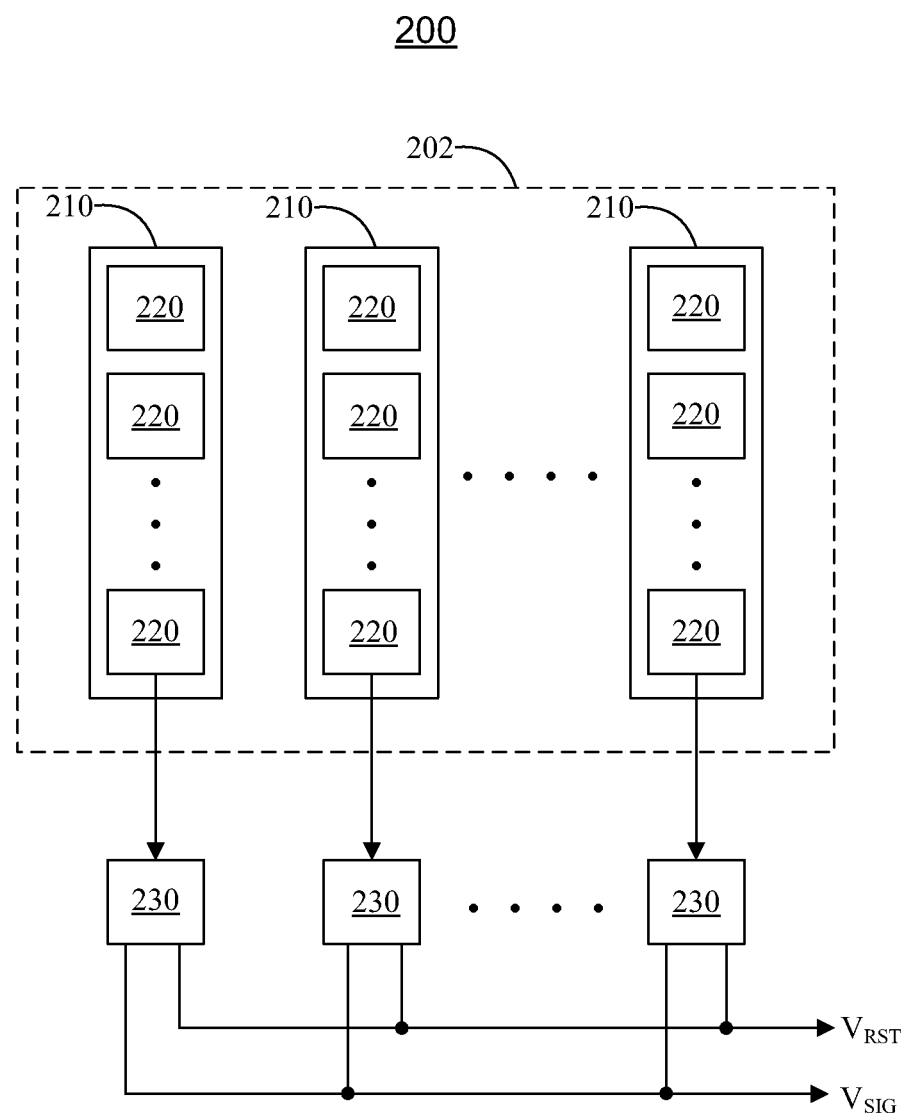
FIG. 2 shows a schematic view of an illustrative pixel array in accordance with some embodiments of the present inventions.

FIG. 2 shows a schematic view of an illustrative pixel array 202. For example, pixel array 202 can correspond to a more detailed view of pixel array 102 of FIG. 1 that illustrates the columns and rows of a pixel array. Each column 210 of pixel array 202 can include two or more rows of pixel cell 220. Each column 210 can include an associated column circuitry 230, where signals from each pixel cell 220 can be read out by its associated column circuitry 230. For example, some or all components of column circuitry 230 can correspond to S/H circuitry 114 of FIG. 1, or column circuitry 230 can include additional components such as amplifier 116 of FIG. 1. As an illustration, during sampling of pixel array 202, a particular row can be selected, thus causing the signals (e.g., $V_{RST}$, $V_{SIG}$, and the like) of the pixel cells of the selected row to be received and stored in their respective column circuitry 230. These signals stored in column circuitry 230 can then be read column-by-column (e.g., in a sequential order, or in any other suitable order) and provided to processing circuitry such as, for example, amplifier 116 and ADC 118 of FIG. 1.

Figure 3:
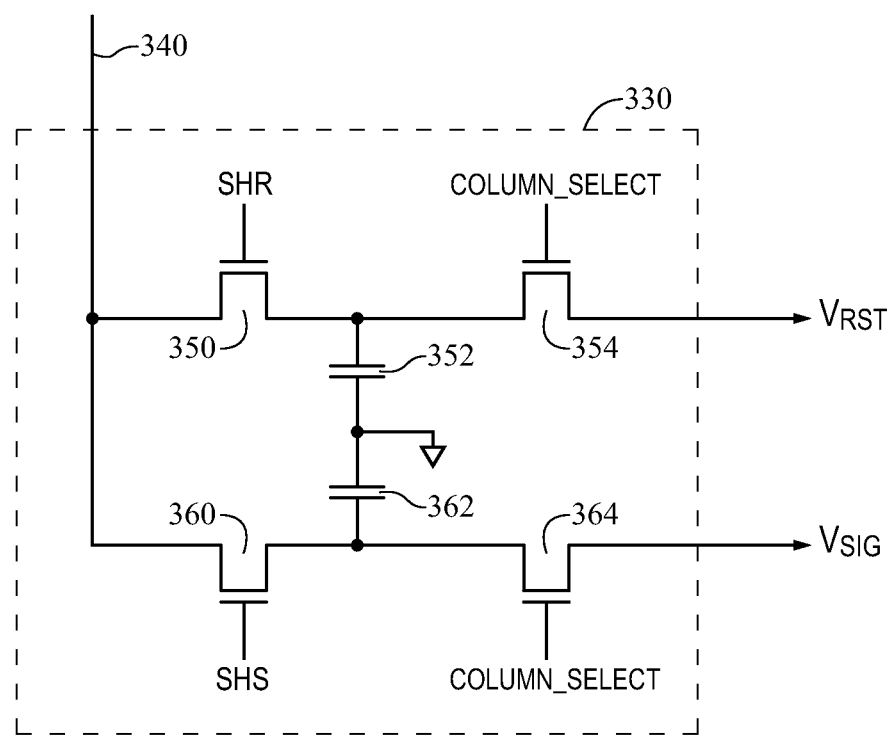
FIG. 3 shows a schematic view of illustrative column circuitry in accordance with some embodiments of the present inventions.

FIG. 3 shows a schematic view of illustrative column circuitry 330. For example, column circuitry 330 can correspond to a more detailed view of column circuitry 230 of FIG. 2. Each column of a pixel array can include its own, associated column line 340. Each pixel cell of that column can be coupled to the associated column line 340, and a pixel cell can output its generated signals (e.g., $V_{RST}$, $V_{SIG}$, and the like) onto column line 340 in response to that pixel cell's row being selected (e.g., selected through row driver 104 of FIG. 1). When a pixel cell's $V_{RST}$ signal is output on column line 340, $V_{RST}$ can be sampled by enabling switch 350 through control signal SHR, thereby allowing $V_{RST}$ to be stored on capacitor 352. Similarly, when a pixel cell's $V_{SIG}$ signal is output on column line 340, $V_{SIG}$ can be sampled and stored on capacitor 362 by enabling switch 360 through the control signal SHS. The $V_{RST}$ and $V_{SIG}$ signals can be provided to other circuitry for further processing by selecting that column. For example, the column can be selected by enabling switches 354 and 364 through the COLUMN_SELECT control signal. The COLUMN_SELECT signal may, for example, be generated through column driver 108 of FIG. 1.

Figure 4:
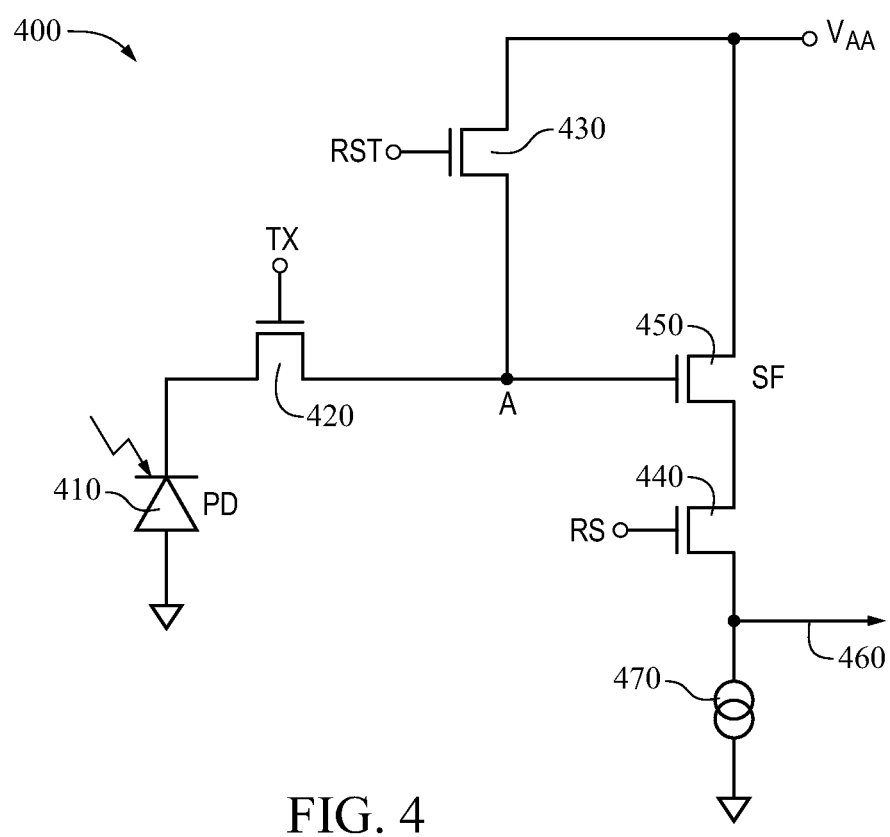
FIG. 4 shows a schematic view of an illustrative pixel cell in accordance with some embodiments of the present invention.

FIG. 4 shows a schematic view of an illustrative pixel cell 400. For example, pixel cell 400 can correspond to a pixel of a pixel array, such as pixel cell 220 of FIG. 2. Pixel cell 400 is depicted in FIG. 4 as a 4-transistor ("4T") active pixel. However, although pixel cell 100 is depicted as such and although the disclosures herein may refer to the particular example of a 4T active pixel, this is for the purpose of illustration and not for limitation. Rather, one skilled in the art should appreciated that the embodiments described herein could alternatively or additionally be implemented with any suitable pixel design, such as, for example, a 3T active pixel, a 5T active pixel, a combined CMOS-charge-coupled device ("CMOS-CCD") imaging system, or any other suitable pixel design or imaging system Pixel cell 400 can include photosensor 410, transfer transistor 420, reset transistor 430, row select transistor 440, and source follower 450. Transfer transistor 420 can be coupled to and controlled by the TX control signal, reset transistor 430 can be coupled to and controlled by the RST control signal, and row select transistor 440 can be coupled to and controlled by the RS control signal. Photosensor 410 can convert incident photons into electrons and can include any suitable device for sensing light. For example, photosensor 410 can include devices such as a photodiode, a photogate, or any other suitable device for sensing light.

In response to row select transistor 440 being turned on by the RS control signal, the voltage at floating diffusion node A can be buffered by source follower 450 and provided to output 460. For example, output 460 can couple to a column line such as, for example, column line 340 of FIG. 3. In this manner, a pixel cell can be selected for outputting its signals (e.g. the signal currently on floating diffusion node A) onto the column line by selectively activating that pixel cell's row select transistor 440 through the RS control signal. Electrons generated by photosensor 410 can be selectively passed to floating diffusion node A by turning on transfer transistor 410 via the TX control signal. For example, by enabling the TX control signal and allowing the charge accumulated by photosensor 410 to pass to floating diffusion node A, pixel cell 400 can generate a $V_{SIG}$ signal. Reset transistor 430 can selectively couple floating diffusion node A to the pixel array's power (illustrated on FIG. 4 and referred to herein as "$V_{AA}$") through the RST control signal. For example, by enabling the RST control signal and thus coupling floating diffusing node A to $V_{AA}$, pixel cell 400 can generate a $V_{RST}$ signal. Although not shown in FIG. 4, the RS command line, TX command line, and/or RST command line can be coupled to all pixel cells in the same row of the pixel array. In some embodiments, output 460 (e.g., and the column line) can be coupled to current sink 470. In some embodiments, pullup circuitry and/or pulldown circuitry can be coupled the column line for selectively maintaining the column line at high or low voltage, respectively.

Figure 5:
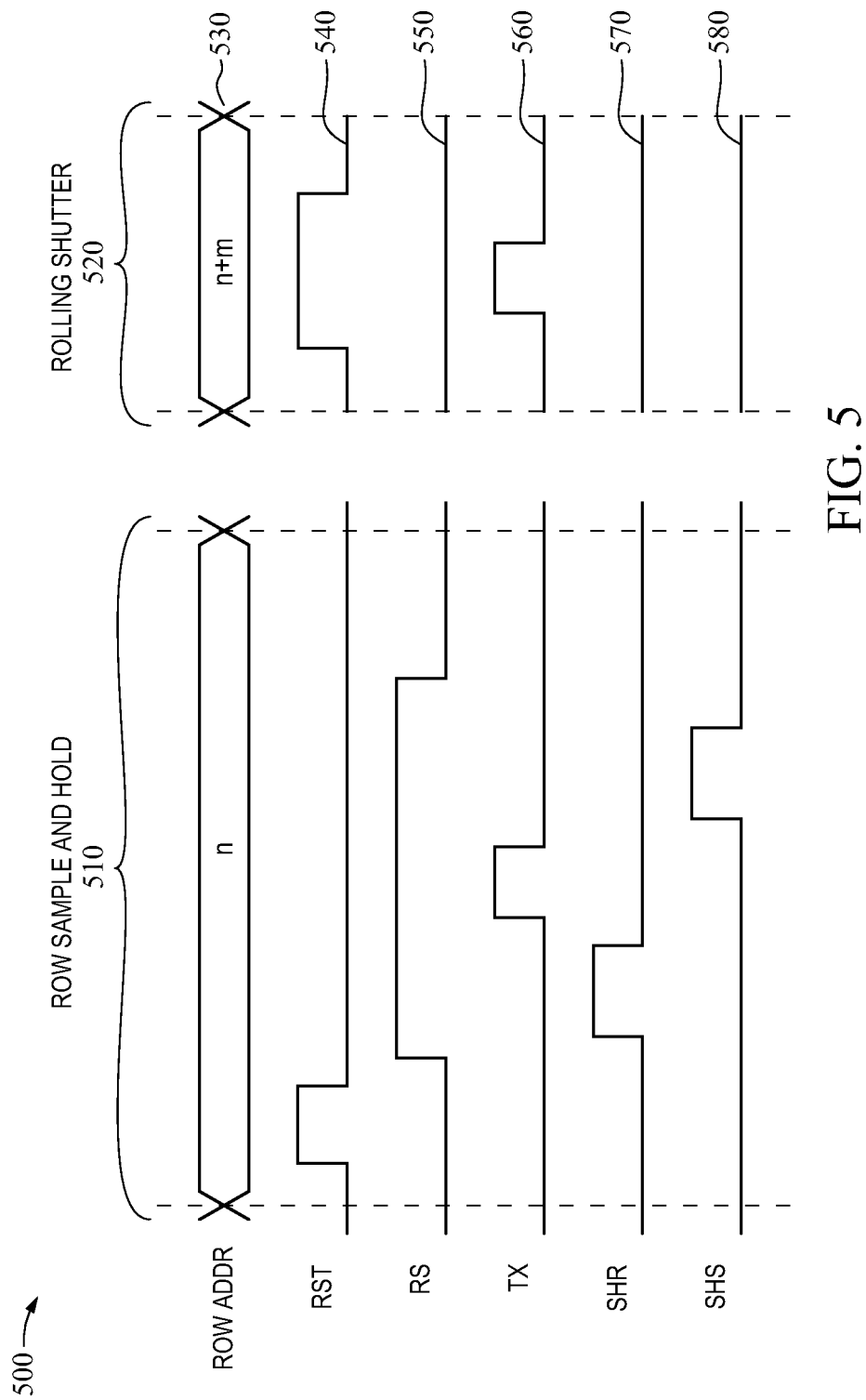
FIG. 5 shows an illustrative timing diagram for the control logic of a pixel array including pixel cells such as the pixel cell of FIG. 4 in accordance with some embodiments of the present invention.

FIG. 5 shows an illustrative timing diagram 500 for the control logic of a pixel array including pixel cells such as pixel cell 400 of FIG. 4. In some embodiments, the operation of pixel cell 400 can include at least two phases, such as the sample and hold ("S/H") phase 510 and the rolling shutter phase 520. As used herein, a sample and hold phase can correspond to the reading out of signals generated by a pixel cell, such as a $V_{RST}$ and $V_{SIG}$ signal. A rolling shutter phase, as used herein, can correspond to the resetting of a photosensor of a pixel cell to begin an image acquisition phase. For example, during an image acquisition phase, each photosensor can be allowed to accumulate charges (e.g., from sensed light) for a period of time referred to herein as the "integration time." Prior to this image acquisition phase, the photosensor can be reset to a known value during rolling shutter phase 520.

Line 530 can represent the row address (e.g., row(n), row (n+m), and the like) to which suitable control signals (e.g., RST, RS, TX, and the like) are currently being applied. Line 540 can represent the RST control signal at a given time. When the RST control signal is logic high, reset transistor 430 can be turned on, thereby coupling floating diffusion node A to the pixel array voltage, $V_{AA}$. Line 550 can represent the RS control signal at a given time. When the RS control signal is logic high, row select transistor 440 can be turned on, thereby allowing the pixel cell's signal to be output onto its respective column line. Line 560 can represent the TX control signal. When the TX control signal is logic high, transfer transistor 420 can be turned on, thereby allowing the charge accumulated by photosensor 410 to flow to floating diffusion node A. Line 570 can represent the SHR control signal. When the SHR control signal is logic high, the pixel cell's $V_{RST}$ can be sampled and held (e.g., by enabling switch 350 of FIG. 3 to allow storage of $V_{RST}$ on capacitor 352 of FIG. 3). Line 580 can represent the SHS control signal. When the SHS control signal is logic high, the pixel cell's $V_{SIG}$ can be sampled and held (e.g., by enabling switch 360 of FIG. 3 to allow storage of $V_{SIG}$ on capacitor 362 of FIG. 3).

The row address is illustrated in FIG. 5 as being based on the "nth" address. As used herein, this "nth" notation is merely meant for illustrating a row's relative position in the sampling sequence, and is not meant to limit the rows to a particular physical position or to an absolute temporal position. For example, row(n) is not necessarily the first row of the pixel array to be read out. Rather, the notation of row (n−1), row(n), row(n+1), row(n+m), etc., merely indicates that row (n−1) is read out immediately preceding row(n) in the sampling sequence, that row(n+1) is read out immediately following row(n) in the sampling sequence, that row(n+m) is read out "m" rows following row(n) in the sampling sequence, and the like. Moreover, this notation does not indicate a physical positioning of the rows and thus row(n+1) may or may not be physically adjacent to row(n), etc.

To begin the S/H phase 510, the RST signal can be set high, thus placing the pixel array voltage, $V_{AA}$, on floating diffusion node A (e.g., assuming no voltage loss within the pixel cell circuitry). The RS and SHR control signals can then be set high, allowing the voltage at floating diffusion node A to be transferred to the column line via source follower 450 and stored in a capacitor, such as capacitor 352 of FIG. 3 (e.g., as the $V_{RST}$ signal). The TX control signal may then be set high, thus allowing charges accumulated by photosensor 410 (e.g., during an image acquisition phase) to be transferred to floating diffusion node A. The resulting voltage signal on floating diffusion node A may then be buffered by source follower 450 and sampled and held by setting the RS and SHS control signal as logic high. For example, the voltage signal can be transferred to the column line and stored in a suitable capacitor, such as capacitor 362 of FIG. 3 (e.g., as the $V_{SIG}$ signal).

During the rolling shutter phase 520, photosensor 410 can be reset by setting the TX and RST control signals as logic high. Setting these two control signals as high can provide an electron flow path between photosensor 410 and the $V_{AA}$ power source. This, in turn, can allow the electrons stored in photosensor 410 to flow to $V_{AA}$, thus emptying photosensor 410 of charges and resetting photosensor 410 to a known value.

As mentioned above, photosensor 410 can be allowed to accumulate charge for an integration period of time (e.g., during an image acquisition period). Generally, this integration period can begin upon the falling edge of the TX control signal during rolling shutter phase 520. The integration period may then end on the falling edge of the TX control signal in S/H phase 520. As shown in FIG. 5, rolling shutter phase 520 is performed on row(n+m) while S/H phase 510 is performed on row(n). In other words, a particular row's photosensors can first be reset and allowed to begin accumulating charge. This particular row can then be sampled and held "m" rows later in the sequence (e.g., they can be sampled when the row address for S/H phase 510 has reached row(n+m)). Accordingly, the amount of time a photosensor is allowed to accumulate charge can be referred to herein as "m" rows of time, where m can be equal to 1, 2, 3, or any other suitable number of rows.

In this manner, the readout of a pixel cell such as pixel cell 400 of FIG. 4 can be performed. However, as illustrated by FIG. 4, such a technique can require the use of 3 metals lines for applying control signals to the pixel cell, as well as 3 drivers to generate these control signals. For example, a metal line and a driver can be required for each of the RST control signal, TX control signal, and RS control signal. In some cases, however, these multiple instance of metal lines can take up additional room on the imaging microchip, thus reducing pixel optical fill factor and reducing the amount of light that can reach the photosensitive area. Moreover, the multiple metal lines can increase metal coupling, thereby increasing noise and reducing the conversion gain and the sensitivity of pixel cell 400.

Figure 6:
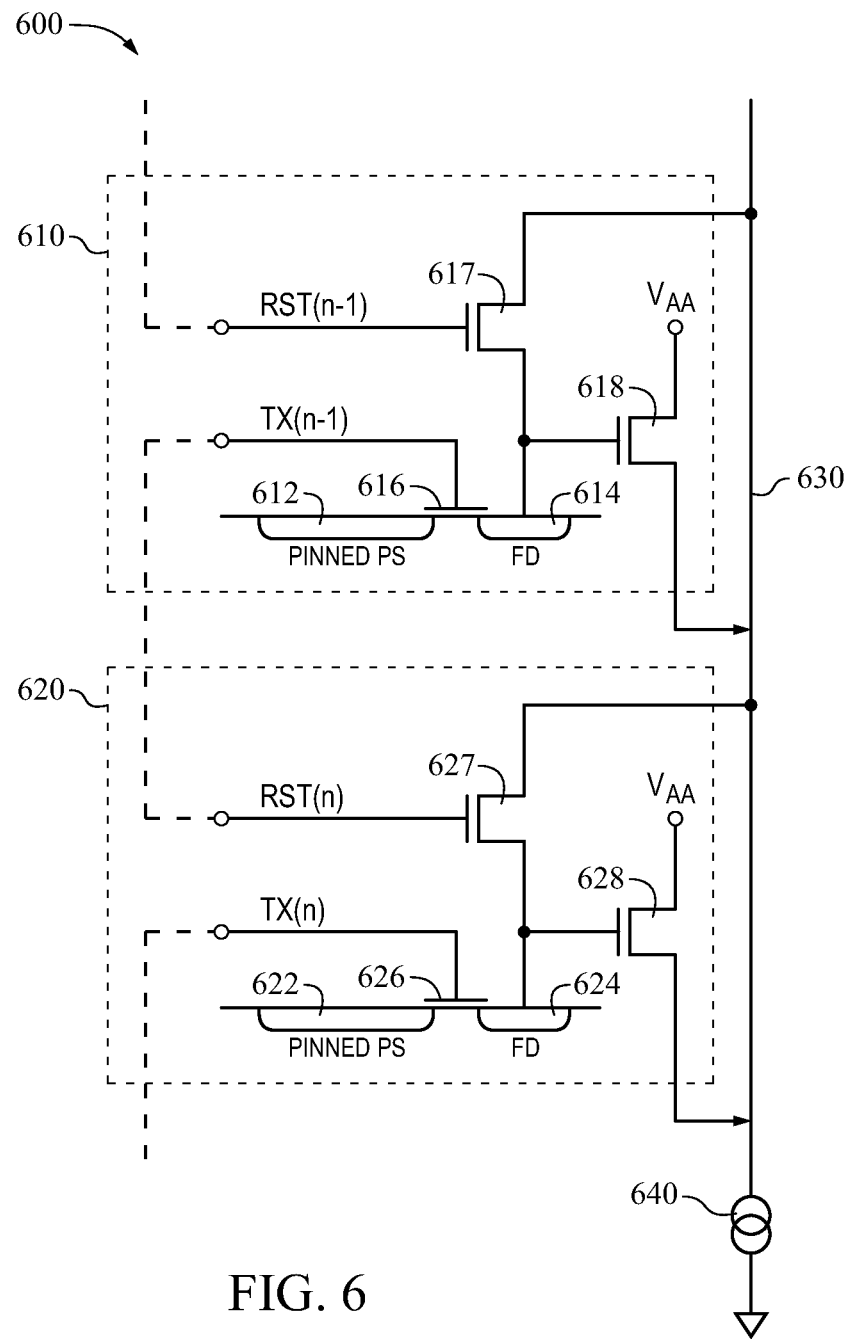
FIG. 6 shows an illustrative system including pixel cells with a reduced number of metal lines in accordance with some embodiments of the present invention.
Figure 7:
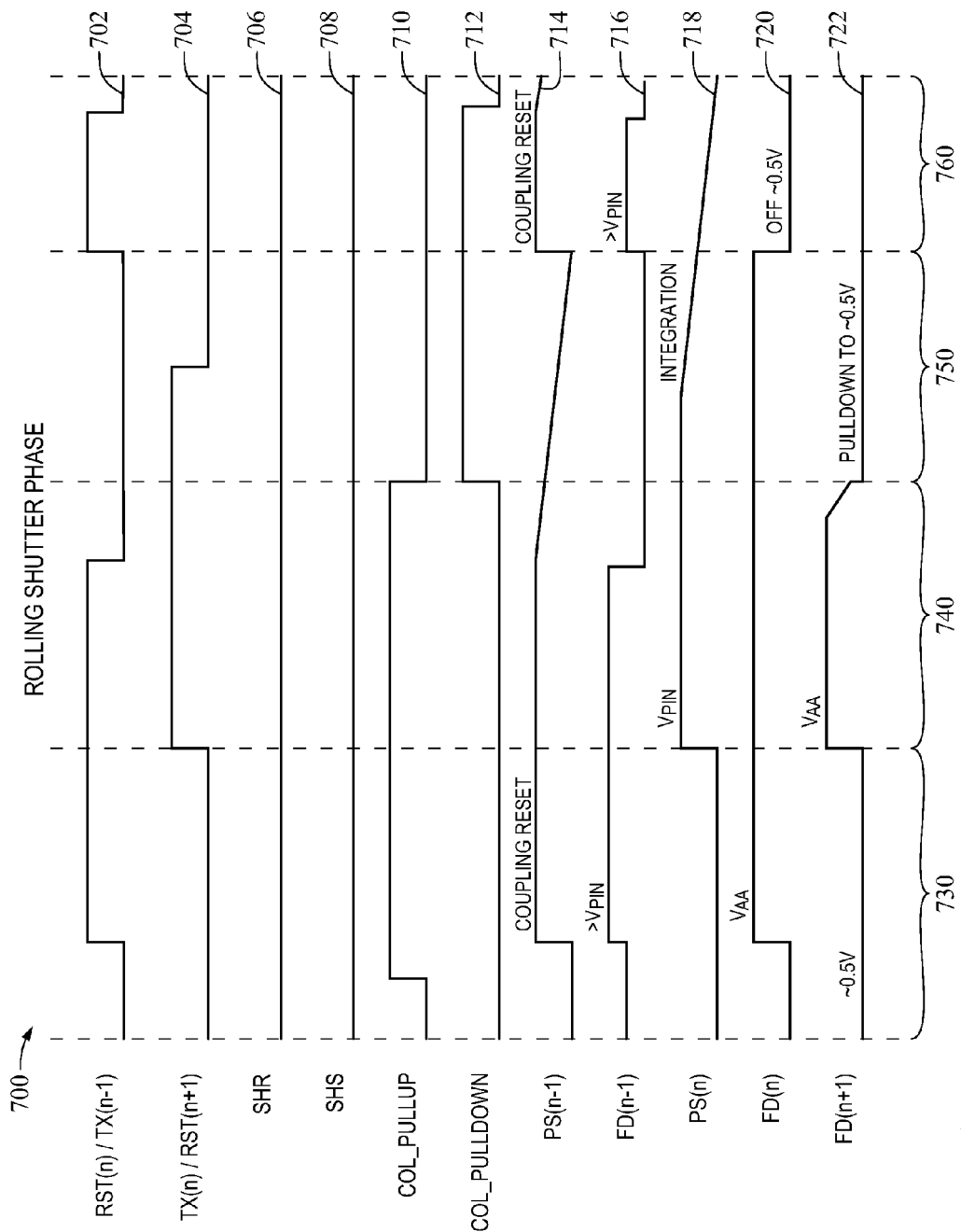
FIG. 7 shows an illustrative timing diagram for a rolling shutter phase of a pixel array including pixel cells of FIG. 6 in accordance with some embodiments of the present invention.
Figure 8:
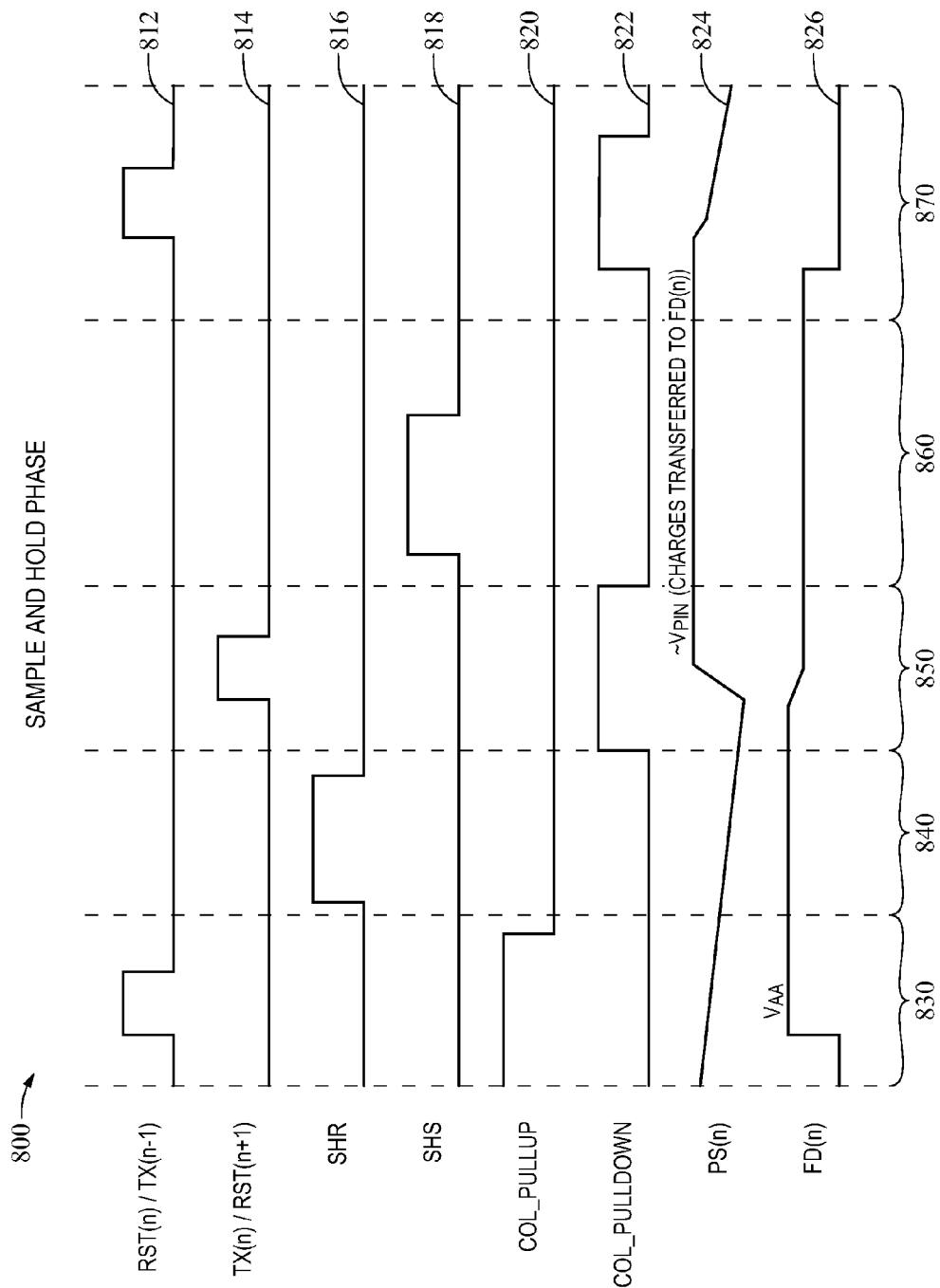
FIG. 8 shows an illustrative timing diagram for a sample and hold phase of a pixel array including pixel cells of FIG. 6 in accordance with some embodiments of the present invention.
Figure 9:
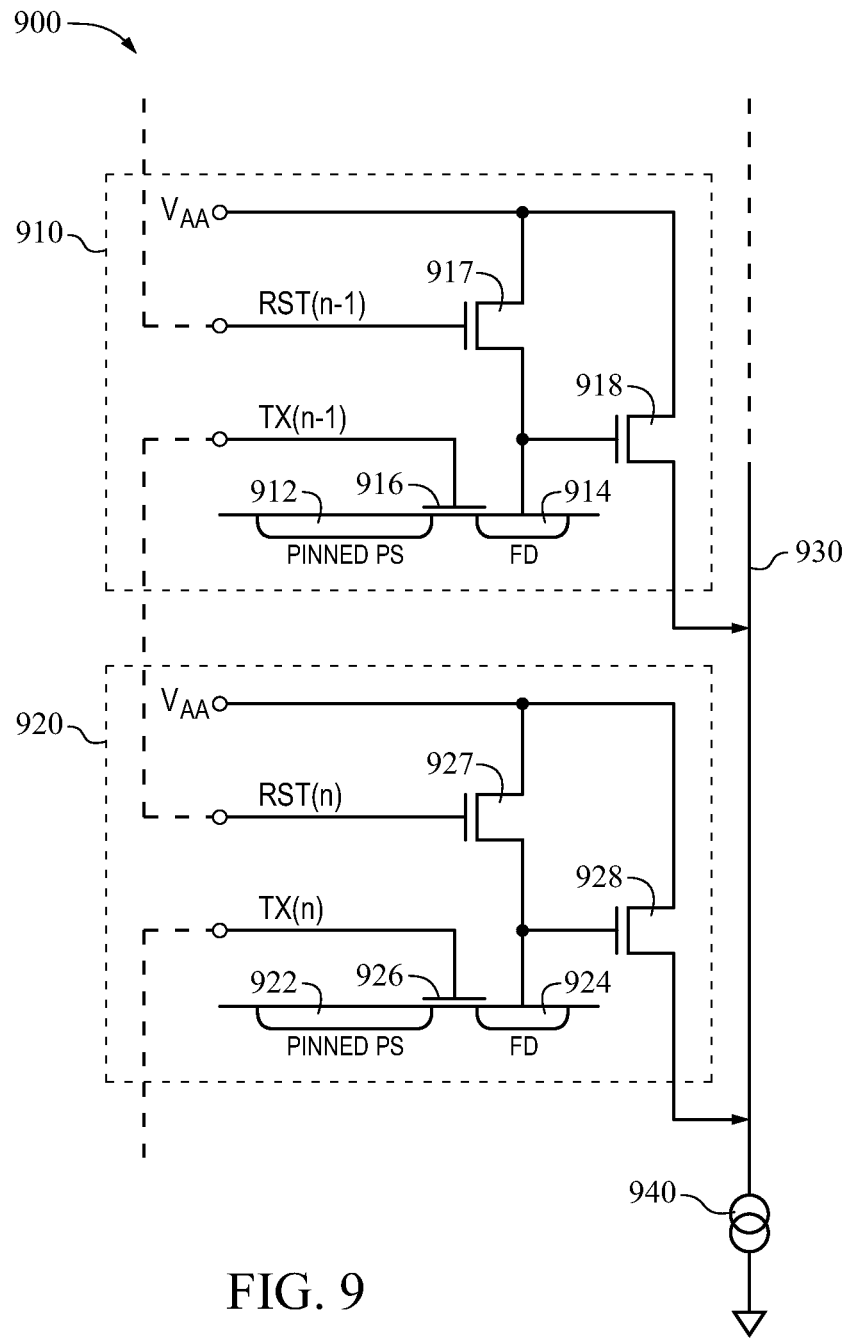
FIG. 9 shows an illustrative system including pixel cells with a reduced number of metal lines in accordance with some embodiments of the present invention.
Figure 10:
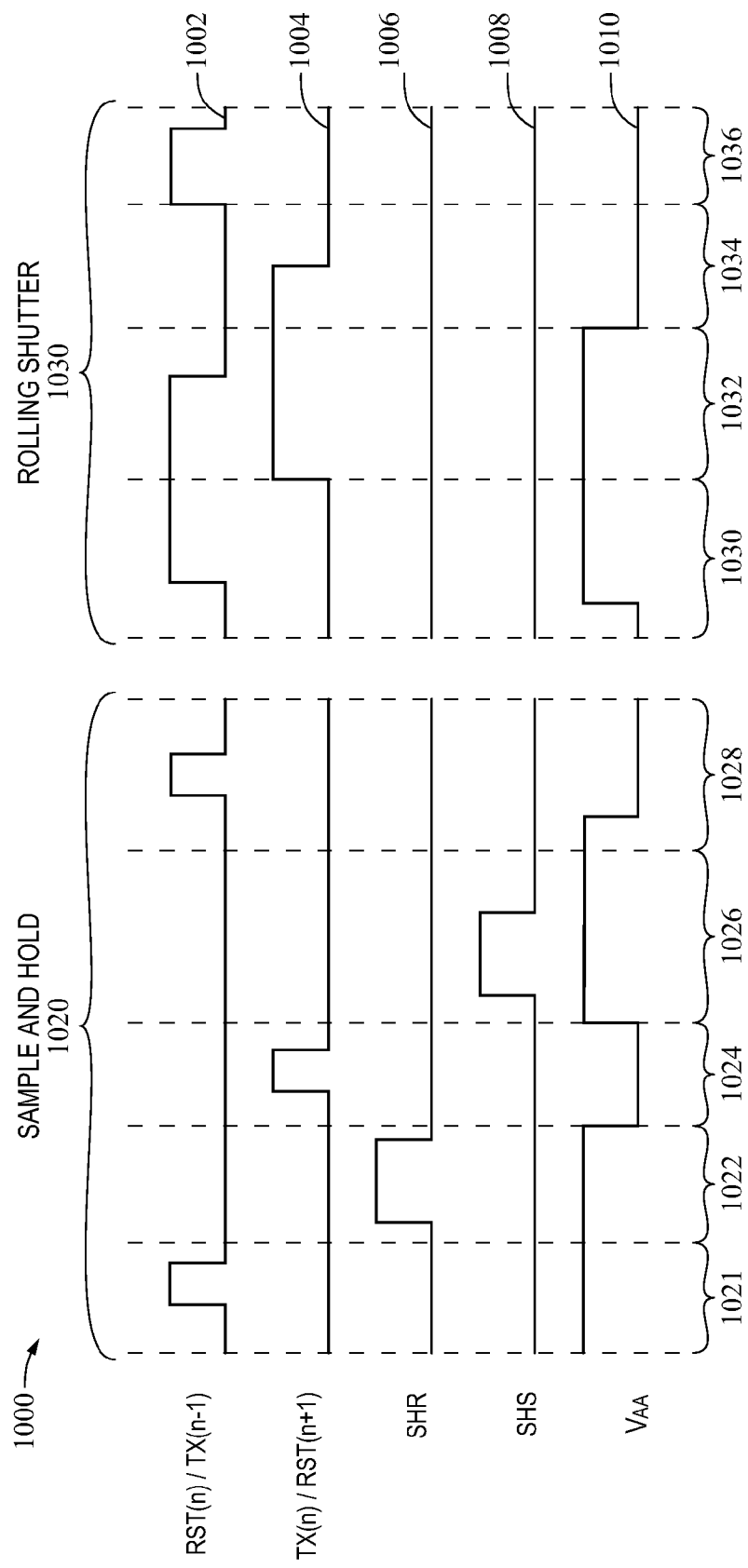
FIG. 10 shows an illustrative timing diagram for the control logic and voltage signals of a pixel array including pixel cells of FIG. 8 in accordance with some embodiments of the present invention.

Accordingly, in some embodiments, pixel cells can be provided with a reduced number of metal lines and/or control signals. Moreover, to operate such reduced metal line pixel cells, modified timing schemes can be used to ensure proper operation of the pixel cells. For example, FIGS. 6 and 9 show schematic diagrams of illustrative systems in which the number of metal lines and control signals per pixel cell have been reduced. FIGS. 7 and 8 show timing diagrams corresponding to the operation of pixel arrays including the pixel cells of FIG. 6, and FIG. 10 shows a timing diagram corresponding to the operation of pixel arrays including the pixel cells of FIG. 9.

FIG. 6 shows system 600 illustrating a portion of a pixel array in which the number of metal lines and control signals for pixel operation have been reduced. For example, system 600 shows pixel cell 610 and pixel cell 620 that can each be coupled to column line 630. To form an entire pixel array, pixel cells 610 and/or 620 can be repeated any suitable number of times to form the rows and columns of the pixel array. Each pixel cell can include a photosensor (e.g., photosensors 612 and 622), a floating diffusion ("FD") node (e.g., FD nodes 614 and 624), a transfer transistor (e.g., transfer transistor 616 and 626), a reset transistor (e.g., reset transistors 617 and 627), and a source follower (e.g., source followers 618 and 628). In some embodiments, column line 630 can be coupled to current sink 640. Photosensors 612 and 622 can include any suitable light-sensing device, such as a pinned photodiode, a photogate, and the like. In some embodiments, photosensors 612 and 622 can be a "pinned photodiode," such that their respective potential is equal to a constant value (e.g., referred to herein as "$V_{PIN}$") when that photodiode is completely depleted. For example, upon resetting the photosensor during a rolling shutter phase of the imaging system, the photodiode can be completely depleted and its potential may then be equal to $V_{PIN}$.

Transfer transistors 616 and 626 can be turned on by enabling the respective TX control signal of their row address (e.g., TX(n−1) for transfer transistor 616 and TX(n) for transfer transistor 626, and the like), thereby allowing charge accumulated by the respective pinned photodiodes to flow to FD node 614 and 624, respectively. Similarly, reset transistors 617 and 627 can be turned on by enabling the respective RST control signal of their row address (e.g., RST(n−1) for reset transistor 617 and RST(n) for reset transistor 627, and the like), thereby setting the FD node at a desired reset voltage value. The voltage value at FD nodes 614 and 624 may be buffered by their respective source followers and output on column line 630 for readout. As the drain of the reset transistors 617 and 627 are each coupled to column line 630, setting the RST control signal as high can couple the FD node of the respective pixel cell to column line 630. In other words, the FD node can be set to the voltage value of column line 630 (e.g., assuming no voltage loss in the pixel array circuitry). In some embodiments, column line 630 can be coupled to pulldown circuitry and/or pullup circuitry for selectively keeping column line 630 at a high signal or a low signal, respectively. Accordingly, as an illustration, when pullup circuitry is pulling column line 630 to a high voltage and the RST(n) control signal is enabled, then FD node 624 can be reset to this high voltage value.

As shown by FIG. 6, each pixel cell of system 600 does not include a row select transistor, and therefore does not require a RS metal line or a corresponding control signal. Moreover, the gate of the reset transistor of each row is coupled to the gate of the transfer transistor of the previous row. For example, as illustrated in FIG. 6, the RST(n) metal line is coupled to the TX(n−1) metal line (e.g., although not drawn in FIG. 6, a RST(n+1) metal line can be coupled to the TX(n) metal line, the RST(n−1) metal line can be coupled to a TX(n−2) metal line, and so forth). Similar to the metal lines of FIG. 4, the RST(n)/TX(n−1) shared metal lines can be coupled to all pixel cells in the same row of the pixel array. In this manner, since the pixel cells of system 600 do not have a RS metal line and include a shared RST(n)/TX(n−1) metal line, each pixel cell can average only a single metal line per pixel cell. Accordingly, system 600 can have fewer metal lines per a pixel cell than a system such as pixel cell 400 of FIG. 4, that can use 3 metal lines per pixel cell. This reduced number of metal lines can provide many benefits for an imaging system such as, for example, allowing for an increase in the optical fill factor of the pixel, allowing for increased conversion gain (e.g., by reducing metal coupling), reducing the number of required row drivers (e.g., thereby allowing for a reduction in microchip size), and the like.

Operation of a reduced metal line system, such as system 600, can use a modified timing approach for both the sample and hold phase and rolling shutter phase to ensure proper operation of its pixel cells. For example, FIGS. 7 and 8 show timing diagrams for rolling shutter phase 700 and sample and hold ("S/H") phase 800, respectively, for the control logic and voltage signals of system 600. As described above with regards to timing diagram 500 of FIG. 5, the notion of an "nth" row in FIGS. 7 and 8 is merely meant for illustrating a row's relative position in the sampling sequence, and is not meant to limit the rows to a particular physical position or to an absolute temporal position. For example, the notation of (n−1), (n), (n+1), etc., merely indicates that (n−1) refers to a row immediately preceding row(n) in the sequence, that (n+1) refers to a row immediately following row(n) in the sequence, and the like. Moreover, as is also described above with regards to FIG. 5, in some embodiments rolling shutter phase 700 for a particular pixel cell can occur "m" rows before the sample and hold phase 800 for that same, particular pixel cell. In other words, a pixel cell can be allowed to accumulated charges from sensed light for an integration period of "m" rows of time.

In rolling shutter phase 700, lines 702, 704, 706, 708, 710, and 712 can represent control signals of the imaging system. In particular, line 702 can represent a shared RST(n)/TX(n−1) control signal, such as a control signal coupled to transfer transistor 616 and reset transistor 627 of FIG. 6. When the RST(n)/TX(n−1) control signal is logic high, a transfer transistor for a previous row and a reset transistor for a current row (e.g., transfer transistor 616 and reset transistor 627 of FIG. 6) can be turned on. Similarly, line 704 can represent a shared TX(n)/RST(n+1) control signal, such as a control signal coupled to transfer transistor 626 of FIG. 6 and coupled to a reset transistor in a next row of the pixel array (not shown in FIG. 6). When the TX(n)/RST(n+1) control signal is logic high, a transfer transistor for a current row and a reset transistor for a next row (e.g., transfer transistor 626 of FIG. 6 and a reset transistor in a next row) can be turned on. Line 706 can represent the SHR control signal. When the SHR control signal is logic high, the signal currently on the column line (e.g., column line 630) can be sampled and held as the $V_{RST}$ signal (e.g., by enabling a switch such as switch 350 of FIG. 3 to allow storage of $V_{RST}$ on capacitor 352 of FIG. 3). Line 708 can represent the SHS control signal. When the SHS control signal is logic high, the signal currently on the column line (e.g., column line 630) can be sampled and held as the $V_{SIG}$ signal (e.g., by enabling a switch such as switch 360 of FIG. 3 to allow storage of $V_{SIG}$ on capacitor 362 of FIG. 3). Line 710 can represent a COL_PULLUP control signal for controlling pullup circuitry coupled to the column line. When COL_PULLUP is logic high, the pullup circuitry can pull the column line (e.g., column line 630 of FIG. 6) to a high voltage. For example, as used herein this high voltage value can be defined to be the pixel array voltage, "$V_{AA}$," where $V_{AA}$ can be equal to 2.8 volts or any other suitable voltage value. However, one skilled in the art could appreciate that the column line could be pulled to any other suitably high voltage value through COL_PULLUP and its respective column pull up circuitry. Similarly, line 712 can represent a COL_PULLDOWN control signal for controlling pulldown circuitry coupled to the column line. When COL_PULLDOWN is logic high, the pulldown circuitry can pull the column line (e.g., column line 630 of FIG. 6) to a low voltage (e.g., ground, or any other suitable low voltage).

In rolling shutter phase 700, lines 714, 716, 718, 720, and 722 can represent voltages values at a photosensor ("PS") or at a floating diffusion node ("FD") of pixel cells in the pixel array. In particular, line 714 can represent the voltage at a photosensor of a previous row ("PS(n−1)") at a given point in time and line 718 can represent the voltage at a photosensor of a current row ("PS(n)") at a given point in time. For example, PS(n) can correspond to a voltage value at photosensor 622 of FIG. 6 and PS(n−1) can correspond to a voltage value of a photosensor 612 of FIG. 6. Lines 716, 720, and 722 can represent the voltages at a floating diffusion node of a previous row ("FD(n−1)") at a given point in time, at a floating diffusion node of a current row ("FD(n)") at a given point in time, and at a floating diffusion node of a next row ("FD(n+1)") at a given point in time, respectively. For example, FD(n−1) can correspond to a voltage value at FD node 614 of FIG. 6, FD(n) can correspond to a voltage value at FD node 624 of FIG. 6, and FD(n+1) can correspond to a voltage value at a FD node in a row after pixel cell 620 of FIG. 6 (not shown in FIG. 6).

In segment 730 of rolling shutter phase 700, the pixel cells of row(n) can be prepared for a reset by first turning on their reset transistors. This can be accomplished by setting the RST(n)/TX(n−1) control signal to logic high. This can result in coupling the floating diffusion node of the current row (e.g., FD node 626) to the column line (e.g., column line 630). Also during segment 730, the COL_PULLUP control signal can be set to logic high, thereby coupling the column line to the high voltage value, $V_{AA}$. Accordingly, assuming no voltage loss within the pixel cell circuitry, the voltage at FD(n) can show a voltage of $V_{AA}$ at this point.

In segment 740, the reset can be completed by turning on the transfer transistors of the pixel cells of row(n) (e.g., while the reset transistors are still turned on). This can be accomplished by setting the TX(n)/RST(n+1) control signal to logic high. Turning on both the reset transistors and transfer transistors of row(n) in this manner can provide an electron flow path from the pinned photosensor (e.g., photosensor 622) to the column line (e.g., column line 630). Since the column line is pulled to $V_{AA}$ by the COL_PULLUP control signal at this point, the electrons can flow from the photosensor to the column line, thereby emptying and "resetting" the photosenser. Assuming $V_{AA}$ is a sufficiently high voltage to fully reset the photosensor, then PS(n) can be reset to the pinned voltage, $V_{PIN}$, through this reset. $V_{PIN}$ can be equal to, for example, 1.5 volts, or any other suitable voltage value. As used herein, this technique of resetting a photosenser by turning on the reset and transfer transistors while the column line is pulled to a sufficiently high voltage (e.g., $V_{AA}$) can be referred to as a "strong reset."

As an inherent side result of the strong reset, RST(n+1) is also set to logic high in segment 740. This can result in the side effect of pulling FD(n+1) to the column line voltage (e.g., $V_{AA}$) during segment 740. If FD(n+1) is allowed to stay at a high voltage, the source follower of the pixel cell of the next row (e.g., "SF(n+1)") can be turned on, thus allowing SF(n+1) to inadvertently drive the column. Accordingly, in segment 750, FD(n+1) can be pulled to a low voltage, thereby turning off SF(n+1). This can be accomplished by setting the COL_PULLDOWN control signal to logic high while the TX(n)/RST(n+1) control signal is still set at logic high. This bring FD(n+1) (e.g., and thus the gate of SF(n+1)) to a low voltage value, thereby turning off SF(n+1). Moreover, before COL_PULLDOWN is set to logic high, the RST(n)/TX(n−1) control signal can be set to logic low. In this manner, the pixel cells of the row(n) are de-coupled from the column line prior to the column line being pulled to a low a voltage, and thus the current row may not be affected by the column pulldown in segment 750.

Similarly, the source follower of the current row ("SF(n)") may also be turned off, such that SF(n) does not drive the column line. Accordingly, in segment 760, RST(n)/TX(n−1) can be set to logic high while the column line is still pulled to a low voltage value through COL_PULLDOWN. This can result in coupling FD(n) to the low voltage value of the column line in segment 760, thus turning off SF(n).

Returning to segment 750 of rolling shutter phase 700, it should be noted that the integration period of PS(n) can also begin at this point. In particular, as described above, an integration period for a photosensor can begin upon the falling edge of the TX control signal of the rolling shutter phase. Accordingly, the integration period of PS(n) can begin upon the falling edge of TX(n)/RST(n+1) in segment 750. During an integration period, the voltage at the photosensor can decrease in time as charges are accumulated by the photosensor. If the voltage at the photosensor decreases to zero volts, then the photosensor can be considered saturated. However, this integration period of PS(n) in segment 750 may not reflect the "true" integration period whose accumulated charges can be finally stored as a $V_{SIG}$ signal. Rather, as will be described below, in the sequence illustrated by rolling shutter phase 700, the "true integration" period can begin a row later in time.

To illustrate how this true integration period can proceed, the behavior of PS(n−1) and FD(n−1) (e.g., lines 714 and 716, respectively), can be described. In other words, the voltage values at PS(n−1) and FD(n−1) can correspond to how the current row of rolling shutter phase 700 will behave one row later in time in the sequence. In both segments 730 and 760, the RST(n)/TX(n−1) control signal is set to logic high, thus coupling the pinned photosensor and the floating diffusion nodes of the previous row together (e.g., photosensor 612 and FD node 614). In a process referred to herein as a "coupling reset" (e.g., as opposed to a strong reset), capacitive coupling between the gate of the transfer transistor (e.g., transfer transistor 616) and the FD node (e.g., FD node 614) can result in raising the voltage of the FD node above $V_{PIN}$. This in turn, can cause electrons to empty from the pinned photodiode into the FD node, therefore performing a coupling reset on the photosensor. For example, through the coupling reset, PS(n−1) can be reset to $V_{PIN}$ in both segment 730 and 760. In some embodiments, the voltage at FD(n−1) should be at a low voltage before setting RST(n)/TX(n−1) to a high voltage. After the second coupling reset illustrated in segment 760, the "true integration period" for row(n−1) can begin upon the falling edge of RST(n)/TX(n−1). In other words, when row (n−1) is sampled and a $V_{SIG}$ signal is read from the pixel cells of row(n−1), this $V_{SIG}$ signal can correspond to the amount of charges accumulated since the true integration period began at segment 760.

As opposed to a strong reset in which the photosensor is coupled to the high reset voltage $V_{AA}$ (e.g., or another suitably high voltage value) through the column line, the coupling reset can rely on capacitive coupling to raise the value of the FD node to a voltage high enough to empty PS(n−1). Accordingly, the reset voltage of the coupling reset may be relatively small compared to a reset voltage of a strong reset. This may mean that, unlike the strong reset, the coupling reset may not be able to transfer all electrons from the photosensor to the FD node without injecting some electrons back into the photosensor. However, as was mentioned above, a strong reset is performed on the pixel cells one row prior to the coupling reset. This initial strong reset can remove the larger quantity of charges that have accumulated up to this point and can fully empty the photosensor. Accordingly, the coupling reset may at most only need to remove one row's worth of integrated charges. Therefore, even though the coupling reset may not have as high of a reset voltage as a strong reset, it can still be sufficiently high to remove the charges which have accumulated in the past row and can fully reset the photosensor prior to true integration.

In some embodiments, in addition to the timing scheme described by rolling shutter phase 700, one or more design features can be implemented to aid the proper operation of the imaging system despite the reduced number of metal lines. For example, an asymmetric transfer gate doping profile (e.g., leakier on the FD node's side, therefore creating a bias towards transferring charge from the photosensor to the FD node), a pixel design which maximizes the ratio of the poly overlap capacitance to the total FD node capacitance, a large voltage can be applied to the transfer transistor for the coupling reset (e.g., further increasing the voltage coupling to the FD node), any other designs that can make the coupling reset effective for unidirectional charge transfer, or any combination of the above can be used.

FIG. 8 shows a timing diagram for sample and hold ("S/H") phase 800 for the control logic and voltage signals of system 600. In S/H phase 800, lines 812, 814, 816, 818, 820, and 822 can represent the RST(n)/TX(n−1) control signal, the TX(n)/RST(n+1) control signal, the SHR control signal, the SHS control signal, the COL_PULLUP control signal, and the COL_PULLDOWN control signal, respectively. Lines 824 and 826 can correspond to the voltage value at a photosensor of a current row (e.g., "PS(n)") and a voltage value at a floating diffusion node of a current row (e.g., "FD(n)"), respectively. These control signals and voltage values of FIG. 8 can each correspond to their similarly-named counterparts in FIG. 7. Accordingly, for the purpose of brevity, further descriptions regarding these signals are not included.

At segment 830, the floating diffusion node of the pixel cells of the current row can be reset by setting the COL_PULLUP control signal to logic high and pulsing the RST(n)/TX (n−1) control signal. This may, for example, result in coupling the floating diffusion node (e.g., FD node 624) to the column line (e.g., column line 630), where the column line has been pulled to $V_{AA}$ or another suitably high voltage value by the pullup circuitry. This, in turn, can reset FD(n) to a value of $V_{AA}$, assuming no voltage loss in the pixel array circuitry.

At segment 840, the reset voltage can be sampled by pulsing the SHR control signal. For example, the reset voltage on FD(n) can be buffered by the source follower (e.g., source follower 628) and provided to the column line (e.g., column line 630). The SHR control signal may then turn on a switch (e.g., switch 350 of FIG. 3), thereby allowing the voltage on the column line to sampled and held as the $V_{RST}$ signal. During segment 840, the COL_PULLUP control signal can be set to logic low, such that the column pullup circuitry no longer holds the column line at a high voltage value. In some embodiments, voltage line ("VLN") column line bias circuitry can be turned on prior to the rising edge of the SHR control signal.

At segment 850, the TX(n)/RST(n+1) control signal can be pulsed to allow the charges accumulated by the PS(n) to flow to FD(n). As shown by FIG. 8, prior to segment 850 the photosensor can be accumulating charges during its integration period, as evidenced by the dropping voltage on PS(n) during this time period. When all charges have been transferred from PS(n) to FD(n), the voltage of the photosensor may once again be at its pinned voltage value, $V_{PIN}$. Since the TX(n) control line is also coupled to the RST(n+1) control line, pulsing this control signal may inadvertently result in turning on the source follower of the next row of pixel cells (e.g., "SF(n+1)"), thus allowing SF(n+1) to potentially corrupt the signal value. Accordingly, in order to prevent SF(n+1) from turning on, the COL_PULLDOWN control signal can be set to logic high while the TX(n)/RST(n+1) control signal is pulsed. This may ensure that voltage on the gate of SF(n+1) is kept low and SF(n+1) is maintained in an off state during segment 850.

At segment 860, the SHS control signal can be pulsed to sample and hold the $V_{SIG}$ signal. For example, as mentioned above, in segment 850 the charges from PS(n) can be transferred to FD(n). The resulting voltage on FD(n) can be buffered by the source follower (e.g., source follower 628) and provided to the column line (e.g., column line 630). The SHS control signal may then turn on a switch (e.g., switch 360 of FIG. 3), thereby allowing the voltage on the column line to sampled and held as the $V_{SIG}$ signal.

At segment 870, the current pixel cell can be disconnected from the column line. This can be accomplished by pulsing the RST(n)/TX(n−1) control signal while the COL_PULLDOWN control signal is set to logic high. In other words, FD(n) can be pulled to a low voltage value. This, in turn, can place a low voltage value on the gate of the source follower (e.g., source follower 628), thereby turning off the source follower and de-coupling the pixel cell from the column line.

FIG. 9 shows system 900 illustrating a portion of a pixel array in which the number of metal lines have been reduced. For example, system 900 shows pixel cell 910 and pixel cell 920 that can each be coupled to column line 930. In some embodiments, column line 930 can be coupled to current sink 940. To form an entire pixel array, pixel cells 910 and/or 920 can be repeated any suitable number of times to form the rows and columns of the pixel array. Similar to system 600 of FIG. 6, pixel cells 910 and 920 can each include a pinned photodiode, a FD node, and transfer transistor, a reset transistor, and a source follower. For example, pixel cell 910 can include pinned photodiode 912, FD node 914, transfer transistor 916, reset transistor 917, and source followers 918, that can correspond to, respectively, photosensor 612, FD node 614, transfer transistor 616, reset transistor 617, and source followers 618 of FIG. 6. Similarly, pixel cell 920 can include pinned photodiode 922, FD node 924, transfer transistor 926, reset transistor 927, and source followers 928, that can correspond to, respectively, photosensor 622, FD node 624, transfer transistor 626, reset transistor 627, and source followers 628 of FIG. 6. Since these features of FIG. 9 can correspond to the similar features of FIG. 6, for the purpose of brevity further description of these features is not included.

One difference between system 600 and system 900 can be the coupling of the reset transistors. For example, in system 600 the drain of the reset transistors (e.g., reset transistors 617 and 627) can be coupled to the column line. Accordingly, as was shown in the timing diagrams of FIGS. 7 and 8, pulldown and pullup circuitry can be used to control voltages on the column lines and thus can control the voltages passed by the reset transistors to, for example, the FD nodes (e.g., FD nodes 614 and 624 of FIG. 6) and the gates of the source followers (e.g., source followers 618 and 628 of FIG. 6). In system 900, however, the drain of the reset transistors (e.g., reset transistors 917 and 927) can be coupled to $V_{AA}$. Accordingly, as will be illustrated by the timing diagrams of FIG. 10, operation of the pixel cells of system 900 can proceed similar to operation of the pixel cells of system 600, except that the use of a COL_PULLUP and COL_PULLDOWN control signal can be removed. In particular, in system 900, the function of the COL_PULLUP and COL_PULLDOWN control signals may instead be replaced by setting $V_{AA}$ to a logic high signal and to a logic low signal, respectively.

FIG. 10 shows timing diagram 1000 of the operation of control signals of system 900. In timing diagram 1000, line 1002 can represent a shared RST(n)/TX(n−1) control signal, such as a control signal coupled to reset transistor 927 and transfer transistor 916 of FIG. 9. When the RST(n)/TX(n−1) control signal is logic high, a transfer transistor for a previous row and a reset transistor for a current row (e.g., transfer transistor 916 and reset transistor 927) can be turned on. Similarly, line 1004 can represent a shared TX(n)/RST(n+1) control signal, such as a control signal coupled to transfer transistor 926 of FIG. 9 and coupled to a reset transistor in a next row of the pixel array (not shown in FIG. 9). When the TX(n)/RST(n+1) control signal is logic high, a transfer transistor for a current row and a reset transistor for a next row (e.g., transfer transistor 926 and a reset transistor in a next row) can be turned on. Line 1006 can represent the SHR control signal. When the SHR control signal is logic high, the signal currently on the column line (e.g., column line 930) can be sampled and held as the $V_{RST}$ signal (e.g., by enabling a switch such as switch 350 of FIG. 3 to allow storage of $V_{RST}$ on capacitor 352 of FIG. 3). Line 1008 can represent the SHS control signal. When the SHS control signal is logic high, the signal currently on the column line (e.g., column line 930) can be sampled and held as the $V_{SIG}$ signal (e.g., by enabling a switch such as switch 360 of FIG. 3 to allow storage of $V_{SIG}$ on capacitor 362 of FIG. 3). Line 1010 can represent the pixel array voltage, $V_{AA}$. $V_{AA}$ may, for example, be fired to a logic high or logic low voltage value as suitable during operation of the imaging system.

Timing diagram 1000 can illustrate two phases of the operation of pixel cells of system 900. For example, timing diagram 1000 can illustrate a sample and hold phase 1020 and a rolling shutter phase 1030. Similar to the timing diagrams of FIGS. 5, 7, and 8, in some embodiments rolling shutter phase 1030 for a particular pixel cell can occur "m" rows before the sample and hold phase 1020 for that same, particular pixel cell. In other words, a pixel cell can be allowed to accumulated charges from sensed light for an integration period of "m" rows of time. Moreover, as was described above, the notation of an "nth" row in FIG. 10 is merely meant for illustrating a row's relative position in the sampling sequence, and is not meant to limit the rows to a particular physical position or to an absolute temporal position. For example, the notation of (n−1), (n), (n+1), etc., merely indicates that (n−1) refers to a row immediately preceding row(n) in the sequence, that (n+1) refers to a row immediately following row(n) in the sequence, and the like.

Rolling shutter phase 1030 of FIG. 10 may proceed fairly similar to rolling shutter phase 700 of FIG. 7. For example, the RST(n)/TX(n−1) control signals, TX(n)/RST(n+1) control signals, SHR control signals, and SHS control signals may operate in a similar manner for both rolling shutter phase 1030 and rolling shutter phase 700. Accordingly, for the purpose of brevity, these controls signals will not be described in detail with regards to rolling shutter phase 1030 of FIG. 10. However, in contrast to rolling shutter phase 700, the firing of the $V_{AA}$ signal can be used in rolling shutter phase 1030 in place of a COL_PULLUP and COL_PULLDOWN control signal. For example, in place of setting COL_PULLUP to logic high during segments 730 and 740 of FIG. 7 and setting COL_PULLDOWN to logic high during segments 750 and 760 of FIG. 7, $V_{AA}$ may be set to logic high in segments 1030 and 1032 and then set to logic low in segments 1034 and 1036 of rolling shutter phase 1030. In this manner, the $V_{AA}$ signal can influence system 900 in a manner similar to how the COL_PULLUP and the COL_PULLDOWN control signals can influence system 600.

Likewise, sample and hold phase 1020 of FIG. 10 can proceed in a fairly similar manner to sample and hold phase 800 of FIG. 8, apart from the replacing of the COL_PULLUP and COL_PULLDOWN control signals with a suitable firing of the $V_{AA}$ signal. For example, as described with regards to FIG. 8, the column line can be pulled to logic low in segments 840 and 870 to turn off the source follower in the next row and to turn off the source follower in the current row, respectively. Accordingly, the COL_PULLDOWN signal can be set to logic high in segments 840 and 870 of FIG. 8. Similarly, in sample and hold phase 1020 of FIG. 10, the $V_{AA}$ signal can be fired to logic low in segments 1024 and 1028. In this manner, the $V_{AA}$ signal can be used to turn off the source follower of the next row (e.g., in segment 1024) and to turn off the source follower of the current row (e.g., in segment 1028). As another example, in FIG. 8 the column line can be pulled to logic high (e.g., by setting COL_PULLUP to logic high) during segment 830 in order to reset the floating diffusion node (e.g., FD node 624 of FIG. 6). In a likewise manner, in simple and hold phase 1020 of FIG. 10, the $V_{AA}$ signal can be fired to logic high in segment 1021 to similarly reset the floating diffusion node (e.g., FD node 924 of FIG. 9). The other control signals of system 900 (e.g., RST(n)/TX(n−1), TX(n)/RST(n+1), SHR, SHS, and the like) can operate in a similar manner in segments 1021, 1022, 1024, 1026, and 1028 as they do in segments 830, 840, 850, 860, and 870 of FIG. 8, respectively.

Accordingly, as described above, systems such as systems 600 and 900 can operate with a reduced number of metal control lines. Moreover, the operation of such reduced-metal line systems can utilize modified timing schemes, such as the timing schemes described by FIGS. 7, 8, and 10. This reduction of the metal lines can provide various beneficial results for the imaging system. For example, the metal routing can be significantly reduced, thus resulting in an increased conversion gain for the pixel cells. For example, in some embodiments the conversion gain can be increased by 3.5 times, or by any other suitable number of times. In some embodiments, the routing for the floating diffusion nodes of systems 600 and 900 may span about half the pitch of the pixel. As another example, the single metal line per row of systems 600 and 900 can allow for a large amount of die-space to be used for the light-guide. Moreover, these systems can include a deep photodiode process with a very large fill factor underneath the surface of the silicon. This, in turn, can mitigate cross-talking or other noise that can be present in systems without shared metal lines. As another example, the reduction of metal lines can reduce the complexity of the metal routing, thereby making it easier to achieve a pixel array in which the pixels are arranged in symmetry or near symmetry within the die.

The processes discussed above are intended to be illustrative and not limiting. Persons skilled in the art can appreciate that steps of the processes discussed herein can be omitted, modified, combined, or rearranged, or that any combination of these steps or any additional steps can be performed without departing from the scope of the invention.

It will be apparent to those of ordinary skill in the art that methods involved in the invention may be embodied in a computer program product that includes a machine readable and/or usable medium. For example, such a computer usable medium may consist of a read only memory device, such as a CD ROM disk or conventional ROM device, or a random access memory, such as a hard drive device or a computer diskette, or flash memory device having a computer readable program code stored thereon.

The above described embodiments of the invention are presented for purposes of illustration and not of limitation.

What is claimed is:

1. A pixel array of an imaging system comprising:
a plurality of pixel cells arranged in columns and rows, wherein each pixel cell of the plurality of pixel cells comprises:
a photosensor operable to sense an amount of light impinging on the photosensor;
a transfer transistor operable to selectively pass an image signal corresponding to the amount of sensed light towards an output node of the pixel cell;
a reset transistor operable to selectively couple the pixel cell to a reset voltage, wherein each pixel cell can generate a reset signal corresponding to the reset voltage;
a reset control line for controlling the reset transistor; and
a transfer control line for controlling the transfer transistor, wherein the reset control line is a shared control line shared with a transfer transistor of a previous pixel cell and the transfer control line is a shared control line shared with a reset transistor of a next pixel cell, and wherein each pixel cell of the plurality averages at most one control line per pixel cell; and
a source follower transistor operable to buffer the image signal and selectively provide the image signal to the output node, wherein a drain of the source follower transistor is coupled directly to a pixel array power line of the pixel array.

2. The pixel array of claim 1, wherein:
a drain of the reset transistor is coupled to the pixel array power line of the pixel array.

3. The pixel array of claim 1, wherein:
the photosensor comprises a pinned photodiode, wherein the pinned photodiode is maintained at a pinned voltage when the pinned photodiode is emptied of charges.

4. The pixel array of claim 1, further comprising:
column circuitry operable to:
   readout the reset signal;
   readout the image signal; and
   generate an output signal by calculating a difference between the image signal and the reset signal.

5. A pixel array of an imaging system comprising:
a plurality of pixel cells arranged in columns and rows, wherein each pixel cell of the plurality of pixel cells comprises:
   a photosensor operable to sense an amount of light impinging on the photosensor;
   a transfer transistor operable to selectively pass an image signal corresponding to the amount of sensed light towards an output node of the pixel cell;
   a reset transistor operable to selectively couple the pixel cell to a reset voltage, wherein each pixel cell can generate a reset signal corresponding to the reset voltage;
   a reset control line for controlling the reset transistor; and
   a transfer control line for controlling the transfer transistor, wherein the reset control line is a shared control line shared with a transfer transistor of a previous pixel cell and the transfer control line is a shared control line shared with a reset transistor of a next pixel cell, and wherein each pixel cell of the plurality averages at most one control line per pixel cell, and wherein a drain of the reset transistor is coupled to a column line of the pixel array.

6. A method of performing a signal readout of an imaging system, the method comprising:
   pulsing, at a first instant, a shared RST(n)/TX(n−1) control signal to operate a pixel cell of a current row to generate a reset signal;
   pulsing, at a second instant, a SHR signal to readout the reset signal, wherein the second instant is after the first instant;
   pulsing, at a third instant, a shared TX(n)/RST(n+1) control signal to transfer an amount of charges accumulated by the pixel cell of the current row towards a column line, wherein the third instant is after the second instant;
   pulsing a voltage control signal in a manner operable to maintain a source follower transistor of a pixel cell of a next row in an off state, such that the source follower transistor does not drive the column line, wherein the pulsing of the voltage control signal encompasses the pulsing of the shared TX(n)/RST(n+1) control signal;
   pulsing, at a fourth instant, a SHS signal to readout an image signal corresponding to the amount of charges accumulated by the pixel cell of the current row, wherein the fourth instant is after the third instant; and
   pulsing a COL PULLDOWN control signal to drive the column line to a logic low value, and wherein a gate of the source follower is coupled to the column line via a reset transistor of the pixel cell of the next row.

7. The method of claim 6, wherein the amount of charges correspond to an amount of light sensed by the pixel cell of the current row.

8. The method of claim 6, wherein pulsing the voltage control signal comprises:
   firing a pixel array power line to a logic low value, and wherein a gate of the source follower transistor of the pixel cell of the next row is coupled to the pixel array power line via a reset transistor of the pixel cell of the next row.

9. The method of claim 6, wherein maintaining the source follower transistor in the off state comprises:
   maintaining the source follower transistor in the off state such that the source follower transistor does not drive the column line during the pulsing of the TX(n)/RST(n+1) control signal.

10. The method of claim 6, further comprising:
   turning off a source follower transistor of the pixel cell of the current row at a fifth instant, wherein the fifth instant is after the fourth instant.

11. The method of claim 10, wherein turning off the source follower transistor of the pixel cell of the current row comprises:
   pulsing the shared RST(n)/TX(n−1) control signal at the fifth instant; and
   pulsing the voltage control signal in a manner operable to maintain the source follower transistor of the pixel cell of the current row in an off state, wherein the pulsing of the voltage control signal encompasses the pulsing of the shared RST(n)/TX(n−1) control signal at the fifth instant.

12. A method of performing a rolling shutter phase of an imaging system, wherein the imaging system comprises a plurality of pixel cells arranged in rows, the method comprising:
   performing a strong reset on a row of pixels of the imaging system, wherein the strong reset empties photosensors of the row of pixels of charges, wherein the charges comprise charges accumulated before the strong reset; and
   performing a coupling reset on the row of pixels, wherein the coupling reset occurs one row later in time than the strong reset, and wherein the coupling reset empties the photosensors of at most one row's worth of integrated charges.

13. The method of claim 12, further comprising:
   allowing the photosensor to accumulate charges for an integration period of time, wherein the integration period begins immediately following the coupling reset.

14. The method of claim 13, further comprising:
   sampling the row of pixels to generate at least one signal corresponding to the charges accumulated during the integration period of time, wherein the sampling occurs after the integration period has ended.

15. The method of claim 12, wherein performing the strong reset comprises:
   coupling the photosensors to a high potential, such that the charges accumulated before the strong reset empty from the photosensor towards the high potential.

16. The method of claim 15, wherein coupling the photosensor to the high potential also causes source follower transistors of a next row of pixels to be turned on, and wherein performing the strong reset further comprises:
   turning off the source follower transistors of the next row after the coupling.

17. The method of claim 12, wherein performing the coupling reset comprises:
   coupling a photosensor and a floating diffusion node of each pixel cell of the row to together, wherein capacitive coupling causes a voltage on each floating diffusion node to increase, such that the at most one row's worth of integrated charges empties to the floating diffusion node.

18. The method of claim 12, further comprising:
performing a previous coupling reset on the row of pixels, wherein the previous coupling reset occurs between the strong reset and the coupling reset that empties the photosensors of at most one row's worth of integrated charges.

\* \* \* \* \*